(12) United States Patent
Ueda et al.

(10) Patent No.: US 7,279,342 B2
(45) Date of Patent: Oct. 9, 2007

(54) FERROELECTRIC MEMORY

(75) Inventors: Mamoru Ueda, Nagano (JP); Kazuhiro Masuda, Nagano (JP); Shinichi Fukada, Tokyo (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/210,010

(22) Filed: Aug. 23, 2005

(65) Prior Publication Data

US 2006/0046318 A1    Mar. 2, 2006

(30) Foreign Application Priority Data

Aug. 25, 2004   (JP) ............................ 2004-245361

(51) Int. Cl.
*H01L 21/00* (2006.01)
(52) U.S. Cl. ..................... 438/3; 438/257; 438/593
(58) Field of Classification Search ........ 257/295–298; 438/3, 253, 396
See application file for complete search history.

(56) References Cited

U.S. PATENT DOCUMENTS

2002/0179566 A1* 12/2002 Park ........................ 216/13

2003/0207535 A1* 11/2003 Kutsunai et al. ............ 438/253

FOREIGN PATENT DOCUMENTS

| JP | 11-074488 | 3/1999 |
|---|---|---|
| JP | 2000-101042 | 4/2000 |
| JP | 2002-368200 | 12/2002 |
| JP | 2003-243628 | 8/2003 |
| JP | 2004-221241 | 8/2004 |

OTHER PUBLICATIONS

Communication from Japanese Patent Office regarding counterpart application.

* cited by examiner

*Primary Examiner*—Dung A. Le
(74) *Attorney, Agent, or Firm*—Harness, Dickey & Pierce, P.L.C.

(57) ABSTRACT

A ferroelectric memory includes a base member, a first dielectric layer formed above the base member, a second dielectric layer formed above the first dielectric layer, a contact hole that penetrates the first and second dielectric layers, a plug formed in the contact hole, and a barrier layer formed above the plug, and a ferroelectric capacitor formed from a lower electrode, a ferroelectric layer and an upper electrode successively laminated in a region including above the plug. The second dielectric layer has a property that is more difficult to be polished than the plug and the first dielectric layer.

6 Claims, 4 Drawing Sheets

FERROELECTRIC MEMORY

RELATED APPLICATIONS

This application claims priority to Japanese Patent Application No. 2004-245361 filed Aug. 25, 2004 which is hereby expressly incorporated by reference herein in its entirety.

BACKGROUND

1. Technical Field

The present invention relates to ferroelectric memories and methods for manufacturing the same.

2. Related Art

For ferroelectric memories, the structure in which a ferroelectric capacitor is stacked on a selection transistor is known. A dielectric layer is provided between the ferroelectric capacitor and the selection transistor, and an electrical connection between them is made by a plug embedded in a contact hole in the dielectric layer. The plug is formed by forming a film of conductive layer that is a plug material inside the contact hole and on the dielectric layer, and the entire conductive layer is polished by using a chemical mechanical polishing (CMP) method or the like. However, in this case, a recess (concave section), which is caused by a difference in the polishing rate between the conductive layer and the surrounding dielectric layer, is generated in the conductive layer at the contact hole. If the recess is left remained, the ferroelectric capacitor cannot be formed on a flat surface, so that the stability in the manufacturing process may be damaged, and the reliability may possibly be lowered. It is noted that, in the process of manufacturing the ferroelectric capacitor, a process of oxidizing the ferroelectric layer is necessary, and therefore prevention of oxidation of the plug is required.

It is an object of the present invention to provide ferroelectric memories that can improve the reliability and methods for manufacturing the same.

SUMMARY

A ferroelectric memory in accordance with the present invention includes:
  a base member;
  a first dielectric layer formed above the base member;
  a second dielectric layer formed above the first dielectric layer;
  a contact hole that penetrates the first dielectric layer and the second dielectric layer;
  a plug formed in the contact hole, and a barrier layer formed above the plug; and
  a ferroelectric capacitor formed from a lower electrode, a ferroelectric layer and an upper electrode successively laminated in a region including above the plug,
  wherein the second dielectric layer has a property that is more difficult to be polished than the plug and the first dielectric layer.

According to the present invention, when the plug is formed by conducting a polishing treatment by a planarization process, because the second dielectric layer that is more difficult to be polished than the first dielectric layer serves as a stopper, the amount of recess in the plug can be made greater. For this reason, the barrier layer can be readily thickly formed, and oxidation of the plug can be effectively prevented. Also, the second dielectric layer serves as a hydrogen barrier for the ferroelectric capacitor, such that deterioration of the ferroelectric layer by hydrogen that is generated from the first dielectric layer can be prevented.

It is noted that, in the present invention, a case in which a layer B provided above a specific layer A includes a case where a layer B is provided directly on a layer A, and a case where a layer B is provided above a layer A through another layer. This similarly applies to the following inventions.

The ferroelectric memory may further include an adhesion layer that is formed between the lower electrode and the barrier layer, and formed in a region including the lower electrode.

By this, the adhesion to the lower electrode can be improved.

In the ferroelectric memory, the barrier layer may include one of a titanium aluminum nitride layer and a titanium nitride layer.

In the ferroelectric memory, the second dielectric layer may include one of a silicon nitride layer, a silicon oxinitride layer and an aluminum oxide layer.

The ferroelectric memory may further include another barrier layer that is formed along an inner surface of the contact hole, wherein the plug may be formed inside the other barrier layer.

A method for manufacturing a ferroelectric memory in accordance with the present invention includes:
  (a) forming a contact hole that penetrates a first dielectric layer formed above a base member, and a second dielectric layer formed above the first dielectric layer;
  (b) forming a conductive layer inside the contact hole and above the second dielectric layer;
  (c) forming a plug inside the contact hole, having an upper surface at a position lower than an upper surface of the second dielectric layer, by polishing the conductive layer until the second dielectric layer is exposed;
  (d) forming a barrier layer inside the contact hole and above the plug; and
  (e) forming a ferroelectric capacitor by successively laminating a lower electrode, a ferroelectric layer and an upper electrode in a region including above the plug,
  wherein the second dielectric layer has a property that is more difficult to be polished than the conductive layer and the first dielectric layer.

According to the present invention, when the conductive layer is formed by conducting a polishing treatment by a planarization process, the second dielectric layer that is more difficult to be polished than the first dielectric layer serves as a stopper, such that the amount of recess in the plug can be made greater. For this reason, the barrier layer can be readily thickly formed, and oxidation of the plug can be effectively prevented. Also, the second dielectric layer serves as a hydrogen barrier for the ferroelectric capacitor, such that deterioration of the ferroelectric layer by hydrogen that is generated from the first dielectric layer can be prevented.

In the method for manufacturing a ferroelectric memory may further include forming another barrier layer along an inner surface of the contact hole, before the step (b), wherein the plug may be formed inside the other barrier layer in the step (c).

In the method for manufacturing a ferroelectric memory, the step (c) may include a step conducted by a chemical mechanical polishing method.

In the method for manufacturing a ferroelectric memory, in the step (c), an upper portion of the conductive layer inside the contact hole may be further removed by etching.

By this, the upper portion of the conductive layer is further removed, and therefore the barrier layer can be formed much thicker.

The method for manufacturing a ferroelectric memory may further include forming an adhesion layer in a region including above the barrier layer, after the step (d), wherein the ferroelectric capacitor may be formed above the adhesion layer in the step (e).

By this, the adhesion to the lower electrode can be improved.

In the method for manufacturing a ferroelectric memory, in the step (e), the lower electrode, the ferroelectric layer and the upper electrode may be successively laminated to form a laminated body, and the laminated body and the adhesion layer may be patterned in the same process.

By this, the laminated body that becomes the ferroelectric capacitor and the adhesion layer can be patterned in the same process, such that the manufacturing process can be simplified.

DETAILED DESCRIPTION

Embodiments of the present invention are described below with reference to the accompanying drawings.

FIRST EMBODIMENT

Figure 1:
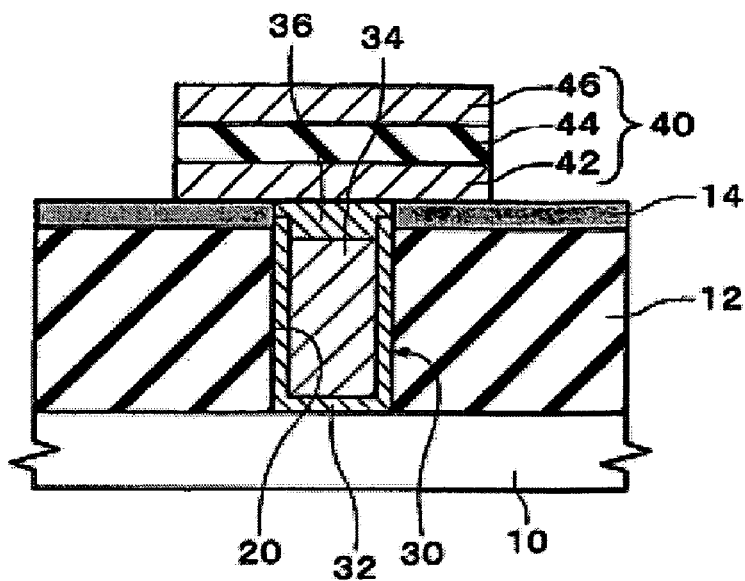
FIG. 1 is a view showing a ferroelectric memory in accordance with a first embodiment of the present invention.

FIG. 1 is a view schematically showing a ferroelectric memory in accordance with a first embodiment of the present invention.

The ferroelectric memory in accordance with the present embodiment includes a base member 10, first and second dielectric layers 12 and 14, a contact hole 20, a contact section 30, and a ferroelectric capacitor 40.

The base member 10 is a semiconductor substrate (for example, a silicon substrate). A plurality of transistors (not shown) is formed in the base member 10. Each transistor includes an impurity region that becomes to be a source region or a drain region, a gate dielectric layer, and a gate electrode. An element isolation region (not shown) is formed between adjacent transistors, to provide electrical insulation between the transistors. The ferroelectric memory in accordance with the present embodiment is, for example, a 1T1C type with a stacked structure.

The first dielectric layer 12 is formed on the base member 10. When the base member 10 is formed from a silicon substrate, the first dielectric layer 12 may be formed from, for example, a silicon oxide layer ($SiO_2$ layer).

The second dielectric layer 14 is formed on the first dielectric layer 12. In other words, the first and second dielectric layers 12 and 14 are successively laminated over the base member 10. The second dielectric layer 14 has a property that is more difficult to be (chemically and mechanically) polished (property of a smaller polishing rate) than the first dielectric layer 12 or a plug 34 to be described below. The second dielectric layer 14 may be formed from at least one of, for example, a silicon nitride layer (SiN layer), a silicon oxinitride layer (SiON layer) and an aluminum oxide layer ($Al_2O_3$ layer). It is noted that the second dielectric layer 14 may cover the entire upper surface of the first dielectric layer 12.

The contact hole 20 penetrates the first and second dielectric layers 12 and 14. More specifically, the contact hole 20 includes a bore 22 that penetrates the first dielectric layer 12 and a second bore 24 that penetrates the second dielectric layer 14 (see FIG. 3), and is formed with the two connected to each other. The contact section 30 having electrical conductivity is formed in the contact hole 20.

The contact hole 30 is formed extending in a direction orthogonal to the surface of the base member 10, and penetrates the first and second dielectric layers 12 and 14. One of end sections of the contact section 30 is electrically connected to a transistor (either a source region or a drain region) in the base substrate 10, and the other end section is electrically connected to the ferroelectric capacitor 40. In other words, the contact section 30 electrically connects the transistor and the ferroelectric capacitor 40.

The contact section 30 includes a plug 34 and a barrier layer 36 over the plug 34. In the example shown in FIG. 1, the contact section 30 further includes another barrier layer 32 formed along an inner surface (bottom surface and side surface) of the contact hole 20. In this case, the plug 34 is formed on the inside surrounded by the barrier layer 32. The plug 34 is formed inside the contact hole 20, and includes, for example, a tungsten (W) layer. The barrier layer 36 may be formed from at least one of, for example, a titanium aluminum nitride layer (TiAlN layer) and a titanium nitride layer (TiN layer). The barrier layer 32 formed along the inner surface of the contact hole 20 may be formed from the same material as that of the barrier layer 36 provided on the plug 34. The barrier layers 32 and 36 make diffusion prevention and oxidation prevention for the plug 34 possible, and the resistance of the contact section 30 can be lowered. Also, the barrier layer 36 may be used to improve the adhesion between the plug 34 and a lower electrode 42 to be described below.

It is noted that the plug 34 has a property that is easier to be polished than the second dielectric layer 14. By this, when the plug 34 is formed by conducting a polishing treatment (for example, a chemical mechanical polishing treatment) by a planarization process, the second dielectric layer 14 can be used as a stopper. In other words, the material of the plug 34 can be preferentially polished while the second dielectric layer 14 is hardly polished.

The ferroelectric capacitor 40 is formed in a region including above the plug 34 (the contact section 30). In other words, in a plan view viewed in a direction orthogonal to the surface of the base member 10, a plane area of the ferroelectric capacitor 40 includes the plug 34 and its surrounding area (the second dielectric layer 14).

The ferroelectric capacitor 40 is formed from a lower electrode 42, a ferroelectric layer 44 and an upper electrode 46 successively laminated. The lower electrode 42 is electrically connected to the plug 34 through the barrier layer 36. More specifically, the lower electrode 42 of the ferroelectric capacitor 40 is electrically connected to either the source region or the drain region of the transistor. In the ferroelectric memory of the present embodiment, the lower electrode 42 of the ferroelectric capacitor 40 is electrically connected to a bit line, and the upper electrode 46 of the ferroelectric capacitor 40 is electrically connected to a plate line, and a gate electrode of the transistor is electrically connected to a word line.

The lower electrode 42 and the upper electrode 46 may be formed from, for example, Pt, Ir, Ir oxide ($IrO_x$), Ru, Ru oxide ($RuO_x$), SrRu compound oxide ($SrRuO_x$), or the like. Each of the lower electrode 42 and the upper electrode 46 may be formed from a single layer, or a plurality of layers.

The ferroelectric layer 44 may be formed with a PZT type ferroelectric composed of oxides including Pb, Zr, and Ti as constituting elements. Alternatively, Pb (Zr, Ti, Nb) $O_3$ (PZTN type) in which Nb is doped at the Ti site may be used. Alternatively, the ferroelectric layer 44 may not be limited to these materials, and for example, any of SBT type, BST type, BIT type and BLT type material can be used.

In the ferroelectric memory in accordance with the present embodiment, for example, when the plug 34 is formed through conducting a polishing treatment by a planarization process (see a manufacturing method to be described below), the amount of recess at the plug 34 can be made greater because the second dielectric layer 14 that is more difficult to be polished than the first dielectric layer 12 serves as a stopper. For this reason, the barrier layer 36 can be readily thickly formed, and oxidation of the plug 34 can be effectively prevented. As a result, an increase in the resistance and a volume expansion of the plug 34 can be prevented. Also, the second dielectric layer 14 serves as a hydrogen barrier for the ferroelectric capacitor 40, such that the ferroelectric layer 44 can be prevented from becoming deteriorated (reduced) by hydrogen that is generated from the first dielectric layer 12.

Next, a method for manufacturing a ferroelectric memory in accordance with an embodiment is described. FIG. 2-FIG. 9 are views schematically showing a method for manufacturing a ferroelectric memory in accordance with the present embodiment.

Figure 2:
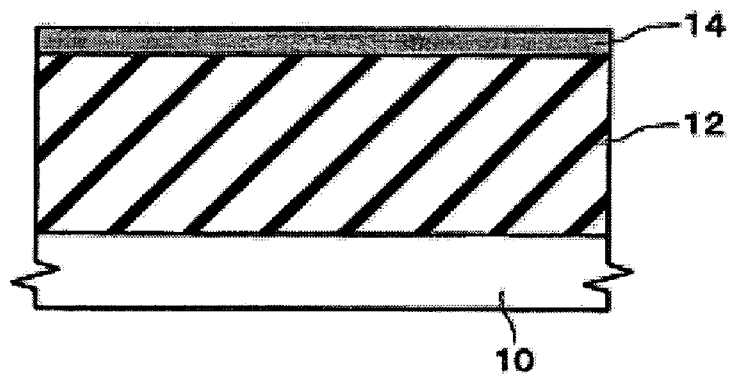
FIG. 2 is a view showing a method for manufacturing the ferroelectric memory in accordance with the first embodiment of the present invention.

As shown in FIG. 2, a first dielectric layer 12 is formed on a base member 10. The first dielectric layer 12 is formed on a surface of the base member 10 where plural transistors are formed. Next, a second dielectric layer 14 is formed on the first dielectric layer 12. The second dielectric layer 14 may be formed in a manner to cover the entire upper surface of the first dielectric layer 12. The first and second dielectric layers 12 and 14 may be formed by using a known technique such as a CVD (Chemical Vapor Deposition) method. It is noted that the materials and properties of the first and second dielectric layers 12 and 14 are the same as those described above.

Figure 3:
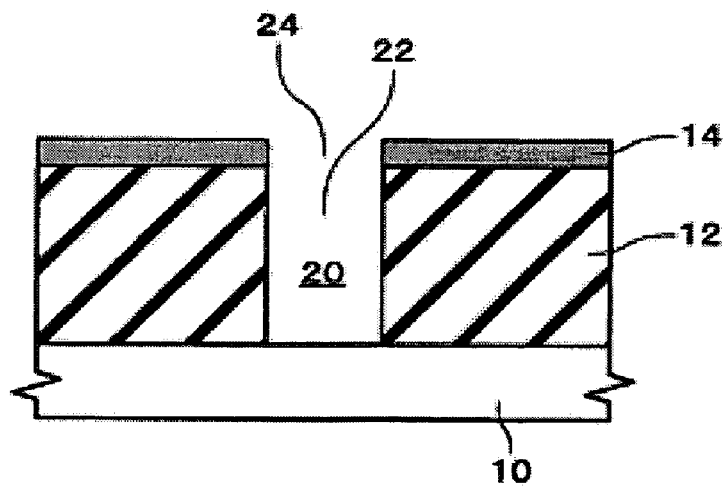
FIG. 3 is a view showing the method for manufacturing the ferroelectric memory in accordance with the first embodiment of the present invention.

As shown in FIG. 3, a contact hole 20 that penetrates the first and second dielectric layers 12 and 14 is formed. In this case, a photolithography technique may be used. More specifically, a resist layer (not shown) that opens over a portion of the second dielectric layer 14 is formed. The portion that opens through the resist layer is etched, thereby forming a bore 24 that penetrates the second dielectric layer 14 and a bore 22 that penetrates the first dielectric layer 12. The contact hole 20 includes the bore 22 and the bore 24, and the bores 22 and 24 are connected with each other. The base member 10 is exposed through the contact hole 20.

As shown in FIG. 4 through FIG. 8, a contact section 30 is formed in the contact hole 20. In the present embodiment, the contact section 30 includes a plug 34, and barrier layers 32 and 36.

Figure 4:
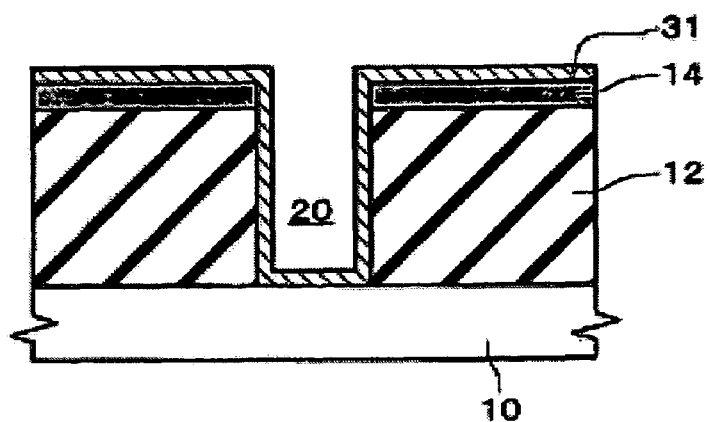
FIG. 4 is a view showing the method for manufacturing the ferroelectric memory in accordance with the first embodiment of the present invention.

First, as shown in FIG. 4, a barrier layer (another barrier layer) 31 is formed along an inner surface of the contact hole 20. The barrier layer 31 may be formed by sputtering or the like. The barrier layer 31 is formed on a side surface (end faces of the first and second dielectric layers 12 and 14) of the contact hole 20 and a bottom surface (an upper surface of the base member 10) of the contact hole 20, and on an upper surface of the second dielectric layer 14 in a manner to be continuous with the portion formed inside the contact hole 20. However, the barrier layer 31 is formed in a manner not to embed the contact hole 20.

Figure 5:
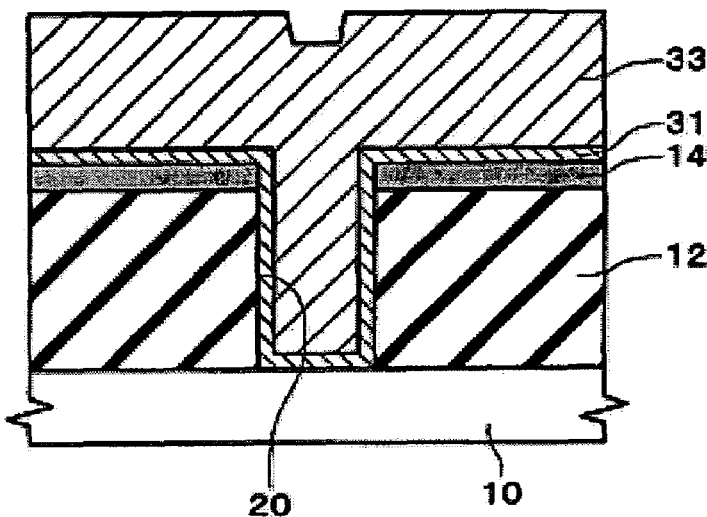
FIG. 5 is a view showing the method for manufacturing the ferroelectric memory in accordance with the first embodiment of the present invention.

Next, as shown in FIG. 5, a conductive layer 33 is formed inside the contact hole 20 and on the second dielectric layer 14. The contact layer 33 is formed in a manner that the interior (more specifically, the inside surrounded by the barrier layer 31) of the contact hole 20 is embedded. When the barrier layer 31 is formed, the conductive layer 33 is formed on the barrier layer 31. The conductive layer 33 may be formed by sputtering or the like.

Figure 6:
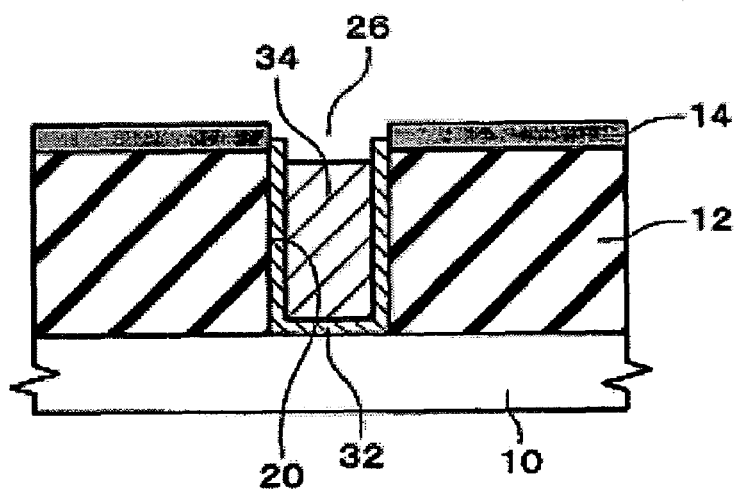
FIG. 6 is a view showing the method for manufacturing the ferroelectric memory in accordance with the first embodiment of the present invention.

Then, as shown in FIG. 6, the conductive layer 33 is polished. In the present embodiment, a portion of the conductive layer 33 and a portion of the barrier layer 31 are polished and removed. In other words, the conductive layer 33 (and the barrier layer 31) is polished until the second dielectric layer 14 that serves as a stopper is exposed. In the polishing process, a process by a chemical mechanical polishing (CMP) method may be used. Because the second dielectric layer 14 has a property that is more difficult to be polished than the conductive layer 33, the conductive layer 33 is more preferentially polished than the second dielectric layer 14. As a result, a recess (a concave portion 26) defined by the conductive layer 33 is generated inside the contact hole 20. In the present embodiment, the second dielectric layer 14 that is more difficult to be polished than the first dielectric layer 12 serves as a stopper, such that the amount of recess in the conductive layer 33 (the plug 34) can be made greater. In other words, the concave portion 26 can be formed deep, and therefore a space can be secured for thickly forming the barrier layer 35 to be described below. Also, because of the presence of the second dielectric layer 14, the first dielectric layer 12 is not polished, and therefore the surface around the contact hole 20 can be better planarized than prior art. It is noted that, when the barrier layer 31 is more readily polished than the second dielectric layer 14, the barrier layer 31 is also preferentially polished than the second dielectric layer 14, and an upper portion of the barrier layer 31 inside the contact hole 20 is also polished and removed, as shown in FIG. 6.

After the aforementioned polishing process is completed, an upper portion of the conductive layer 33 (the plug 34) inside the contact hole 20 may be further removed, in order to form the recess (the concave portion 26) much deeper. For example, the upper portion of the conductive layer 33 may be etched (for example, by dry etching). By so doing, the barrier layer 36 to be described below can be formed much thicker. However, in the present embodiment, because the concave portion 26 can be made deep by the polishing process applied to the conductive layer 33 described above, the etching process may be omitted.

In this manner, the plug 34 can be formed from the conductive layer 33. An upper surface of the plug 34 is at a position lower than the upper surface of the second dielectric layer 14. In other words, the concave portion 26 is formed above the plug 34. Also, the plug 34 is formed inside the barrier layer 32.

Figure 7:
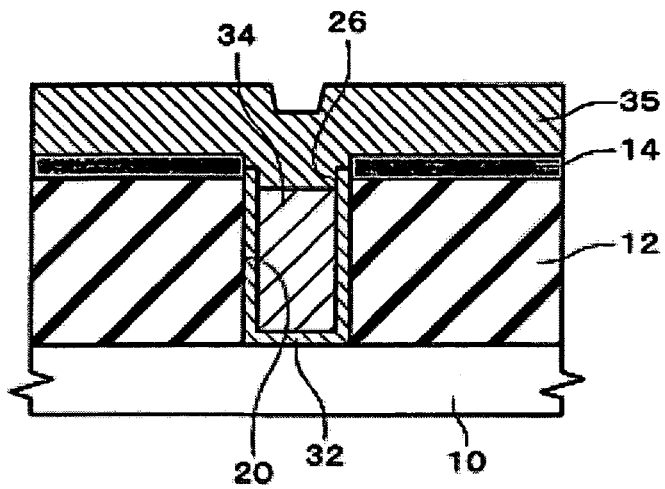
FIG. 7 is a view showing the method for manufacturing the ferroelectric memory in accordance with the first embodiment of the present invention.

Next, as shown in FIG. 7, a barrier layer 35 is formed on the plug 34 inside the contact hole 20 (in other words, in the concave portion 26) and on the second dielectric layer 14. The barrier layer 35 is formed in a manner to embed the concave portion 26. The barrier layer 35 may be formed by sputtering or the like.

Figure 8:
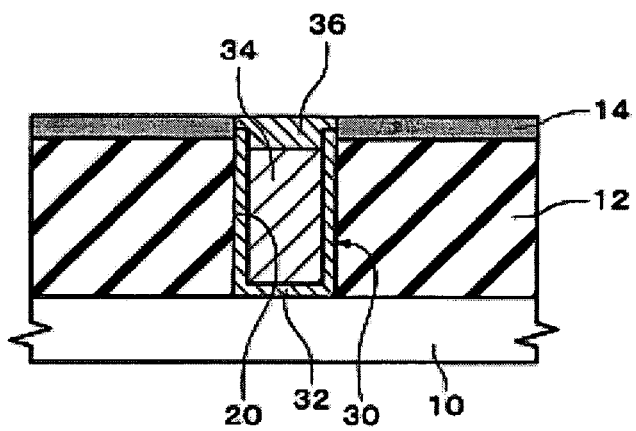
FIG. 8 is a view showing the method for manufacturing the ferroelectric memory in accordance with the first embodiment of the present invention.

Then, as shown in FIG. 8, the barrier layer 35 is polished, thereby forming a barrier layer 36 inside the contact hole 20 over the plug 34. The details of the process for polishing the barrier layer correspond to the details of the process for polishing the conductive layer described above.

In this manner, the contact section 30 can be formed. According to the present embodiment, the recess (concave portion 26) created in the process of forming the plug 34 is eliminated by the formation of the barrier layer 36, such that the upper surface of the contact section 30 and the upper surface of the second dielectric layer 14 are generally flush with each other. Accordingly, a ferroelectric capacitor 40 to be described below can be formed on a flat surface. It is noted that the materials and properties of the barrier layer 32, the plug 34 and the barrier layer 36 are the same as those described above in conjunction with the structure.

Figure 9:
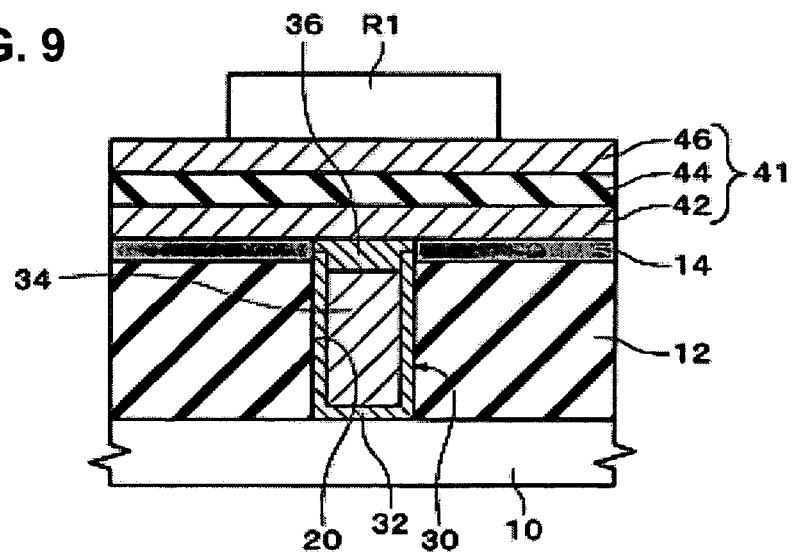
FIG. 9 is a view showing the method for manufacturing the ferroelectric memory in accordance with the first embodiment of the present invention.

As shown in FIG. 9, a ferroelectric capacitor 40 is formed in a region including above the plug 34. Concretely, a lower electrode 42, a ferroelectric layer 44 and an upper electrode 46 are successively laminated to form a laminated body 41, and the laminated body 41 is patterned in a specified configuration.

As a method for forming the lower electrode 42, a sputtering method, a vacuum vapor deposition method, a CVD method, or the like may be used. As a method for forming the ferroelectric layer 44, a solution coating method (including a sol-gel method, a MOD (Metal Organic Decomposition) method, or the like), a MOCVD (Metal Organic Chemical Vapor Deposition) method, or the like can be used. It is noted that the upper electrode 46 can be formed by using a like method applied to the lower electrode 42.

Then, the laminated body 41 is patterned. By using a photolithography technique, a resist layer R1 may be formed on the laminated body 41, and portions of the laminated body 41 exposed through the resist layer R1 may be removed by etching, as shown in FIG. 9.

When the ferroelectric capacitor 40 is formed by patterning the laminated body 41, an anneal treatment in an oxygen atmosphere is conducted for stabilization of the ferroelectric layer 44 (for example, for etching damage recovery). In the present embodiment, because the barrier layer 36 having a predetermined thickness is formed on the plug 34, oxidation of the plug 34 can be effectively prevented.

According to the method for manufacturing a ferroelectric memory in accordance with the present embodiment, when the conductive layer 33 is formed by conducting a polishing treatment by a planarization process, the second dielectric layer 14 that is more difficult to be polished than the first dielectric layer 12 serves as a stopper, such that the amount of recess of the plug 34 can be made greater. For this reason, the barrier layer 36 can be readily made thick, and oxidation of the plug 34 can be effectively prevented. Also, the second dielectric layer 14 serves as a hydrogen barrier for the ferroelectric capacitor, the ferroelectric layer 44 can be prevented from becoming deteriorated (reduced) by hydrogen generated from the first dielectric layer 12.

SECOND EMBODIMENT

Figure 10:
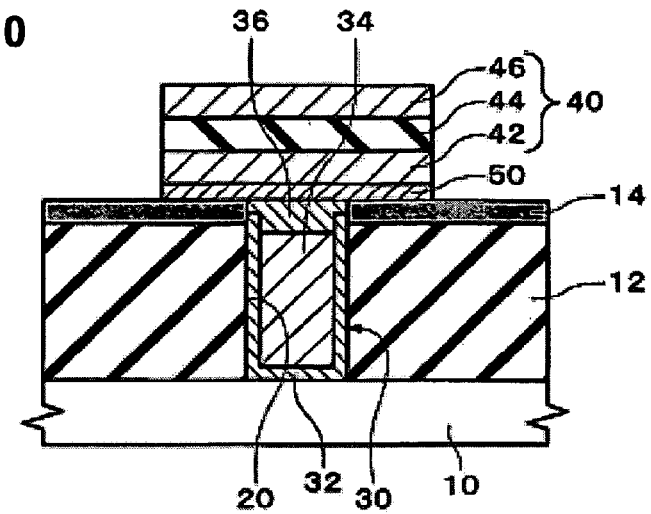
FIG. 10 is a view showing a ferroelectric memory in accordance with a second embodiment of the present invention.

FIG. 10 is a view schematically showing a ferroelectric memory in accordance with a second embodiment of the present invention.

The ferroelectric memory in accordance with the present embodiment includes the composition of the ferroelectric memory described above, and further includes an adhesion layer 50.

The adhesion layer 50 is formed between a lower electrode 42 and a barrier layer 36 (a contact section 30). As shown in FIG. 10, the lower electrode 42 may be formed on one of surfaces of the adhesion layer 50, and the barrier layer 36 may be formed on the other surface. Also, the adhesion layer 50 is formed in a region including the lower electrode 42. In other words, in a plan view viewed in a direction orthogonal to the surface of the base member 10, a plane area of the adhesion layer 50 includes at least a plane area of the lower electrode 42. For example, the plane area of the adhesion layer 50 may generally match with the plane area of the lower electrode 42. The adhesion layer 50 can improve adhesion of the contact section 30 and the second dielectric layer 14 to the ferroelectric capacitor 40.

The adhesion layer 50 may be formed from the same material as that of the barrier layer 36 (for example, a TiAlN layer or a TiN layer), or may be formed from a different material. The adhesion layer 50 has a greater adhesion to the lower electrode 42 than to the plug 34. When the adhesion layer 50 is formed from a material different from that of the barrier layer 36, the adhesion layer 50 may have even a greater adhesion to the lower electrode 42 than to the barrier layer 36.

Figure 11:
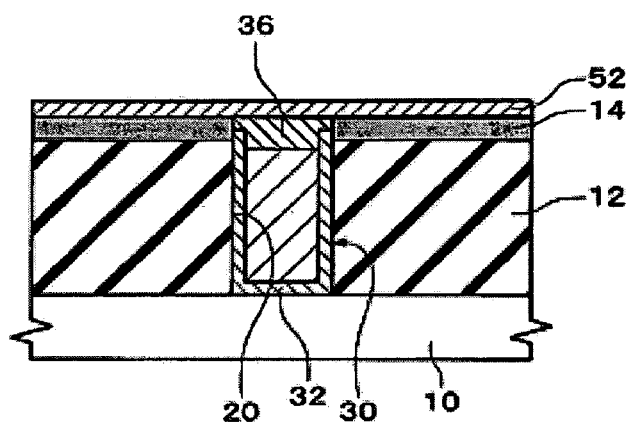
FIG. 11 is a view showing a method for manufacturing the ferroelectric memory in accordance with the second embodiment of the present invention.
Figure 12:
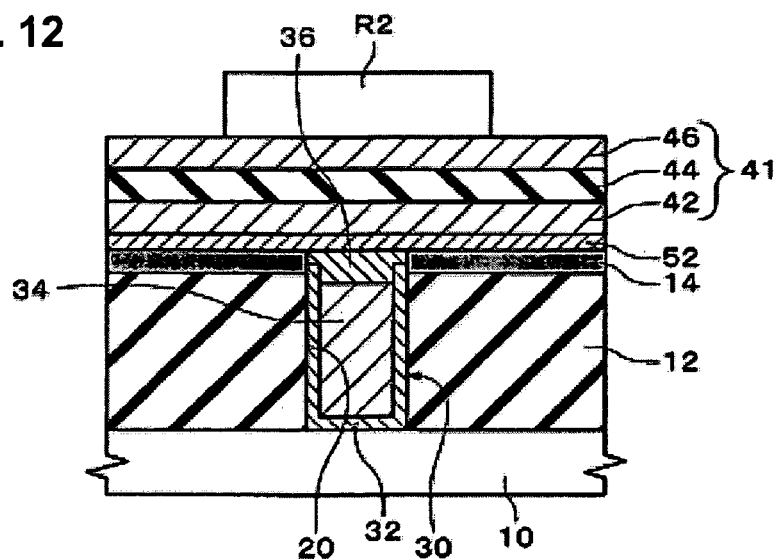
FIG. 12 is a view showing the method for manufacturing the ferroelectric memory in accordance with the second embodiment of the present invention.

Next, a method for manufacturing a ferroelectric memory in accordance with the present embodiment is described. FIG. 11 and FIG. 12 are views schematically showing the method for manufacturing a ferroelectric memory in accordance with the present embodiment.

As shown in FIG. 11, after the contact section 30 is formed in the contact hole 20, an adhesion layer 52 is formed in a region including above the barrier layer 36. The adhesion layer 52 is formed on the barrier layer 36 and on the surrounding second dielectric layer 14. For example, the adhesion layer 52 may be formed by sputtering or the like.

Then, as shown in FIG. 12, a laminated body 41 that becomes a ferroelectric capacitor 40 is formed on the adhesion layer 52, and the laminated body 41 and the adhesion layer 52 are patterned in the same process. When the patterning is conducted by using a photolithography technique, a resist layer R2 is formed on the laminated body 41, and portions of the laminated body 41 exposed through the resist layer R2 are removed by etching. By the same etching process, both of the laminated body 41 and the adhesion layer 52 may be patterned at the same time.

Accordingly, the ferroelectric capacitor 40 and the adhesion layer 50 can be patterned and formed by the same process, such that the manufacturing process can be simplified.

It is noted that other compositions and effects of the present embodiment include the compositions and effects that can be derived from the description of the first embodiment.

The present invention is not limited to the embodiments described above, and many modifications can be made. For example, the present invention may include compositions that are substantially the same as the compositions described in the embodiments (for example, a composition with the same function, method and result, or a composition with the same objects and results). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. A ferroelectric memory comprising:
   a base member;
   a first dielectric layer formed above the base member;
   a second dielectric layer formed above the first dielectric layer;
   a contact hole that penetrates the first dielectric layer and the second dielectric layer;
   a first barrier layer formed in the contact hole, an upper edge of the first barrier layer being lower than a surface of the second dielectric layer;
   a plug formed in the contact hole,
   wherein an upper edge of the plug is lower than the upper edge of the first barrier layer;
   a second barrier layer formed above the first barrier layer and the plug; and
   a ferroelectric capacitor formed from a lower electrode, a ferroelectric layer and an upper electrode successively laminated in a region including above the plug,
   wherein the second dielectric layer has a property that is more difficult to polish than the plug and the first dielectric layer.

2. A ferroelectric memory according to claim 1, further comprising an adhesion layer formed between the lower electrode and the second barrier layer and formed in a region including the lower electrode.

3. A ferroelectric memory according to claim 1, wherein the second barrier layer includes one of a titanium aluminum nitride layer and a titanium nitride layer.

4. A ferroelectric memory according to claim 1, wherein the second dielectric layer includes one of a silicon nitride layer, a silicon oxinitride layer and an aluminum oxide layer.

5. A ferroelectric memory according to claim 1, wherein the plug is formed inside the first barrier layer.

6. A ferroelectric memory according to claim 1, wherein an upper surface of the second barrier layer has a same surface height as the second dielectric layer.

* * * * *